(12) United States Patent
De

(10) Patent No.: US 6,470,946 B2
(45) Date of Patent: Oct. 29, 2002

(54) WAFER DEMOUNT GAS DISTRIBUTION TOOL

(75) Inventor: Bhola De, Congers, NY (US)

(73) Assignee: Anadigics, Inc., Warren, NJ (US)

( * ) Notice: Subject to any disclaimer, the term of this patent is extended or adjusted under 35 U.S.C. 154(b) by 87 days.

(21) Appl. No.: 09/776,922

(22) Filed: Feb. 6, 2001

(65) Prior Publication Data

US 2002/0104622 A1 Aug. 8, 2002

(51) Int. Cl.$^7$ ............................................. B32B 35/00
(52) U.S. Cl. ..................... 156/584; 156/287; 156/344; 156/382
(58) Field of Search ........................ 156/344, 584, 156/287, 382

(56) References Cited

U.S. PATENT DOCUMENTS

| | | | | |
|---|---|---|---|---|
| 989,608 | A | * 4/1911 | Jackson | 122/23 |
| 2,673,918 | A | * 3/1954 | Lawton | 122/40 |
| 3,192,091 | A | * 6/1965 | Hey et al. | 156/292 |
| 4,255,216 | A | * 3/1981 | Conant et al. | 156/254 |
| 4,466,852 | A | 8/1984 | Beltz et al. | 156/344 |
| 4,555,381 | A | * 11/1985 | Chazal et al. | 156/224 |
| 4,949,783 | A | 8/1990 | Lakios et al. | 165/80.1 |
| 5,108,532 | A | * 4/1992 | Thein et al. | 156/285 |
| 5,447,597 | A | * 9/1995 | Zimmerman et al. | 156/584 |
| 5,632,847 | A | 5/1997 | Ohno et al. | 156/344 |
| 6,367,530 | B1 | * 4/2002 | Shimotomai | 156/382 |

* cited by examiner

Primary Examiner—Mark A. Osele
(74) Attorney, Agent, or Firm—Pennie & Edmonds LLP

(57) ABSTRACT

A wafer demounting receptacle comprises a substantially circular plate member and an upstanding rim structure provided around a periphery of the plate member. The rim structure is stepped and includes a first step defining a first diameter, and a second step defining a second diameter grater than the first diameter. The riser of the first step has a very low height so that a gap between the plate member and a fragile semiconductor wafer bonded to a carrier having a peripheral abutment surface resting on the run of the first step, limits the bending of an edge portion of the wafer in a direction towards the plate member while the wafer is partially demounted from a wafer carrier. The plate member is further provided with a pattern of holes that generates eddy currents in a solvent that flows over the wafer, carrier, and receptacle so as to soften and dissolve the mounting adhesive between the wafer and carrier such that the wafer is separated from the carrier. The wafer demount receptacle can be used in conjunction with a wafer demount tool comprising a chamber defined between a backing plate and a contact plate. The chamber is provided with a gas inlet for introducing a pressurized gas, while the contact plate is provided with a plurality of through-holes. The wafer demount tool is mated to the wafer demount receptacle such that the contact plate is juxtaposed against the back side of a wafer carrier resting in the wafer demount receptacle. Pressurized gas flowing through the wafer demount tool displaces solvent from the wafer-carrier interface to further promote separation of the wafer from the carrier.

5 Claims, 9 Drawing Sheets

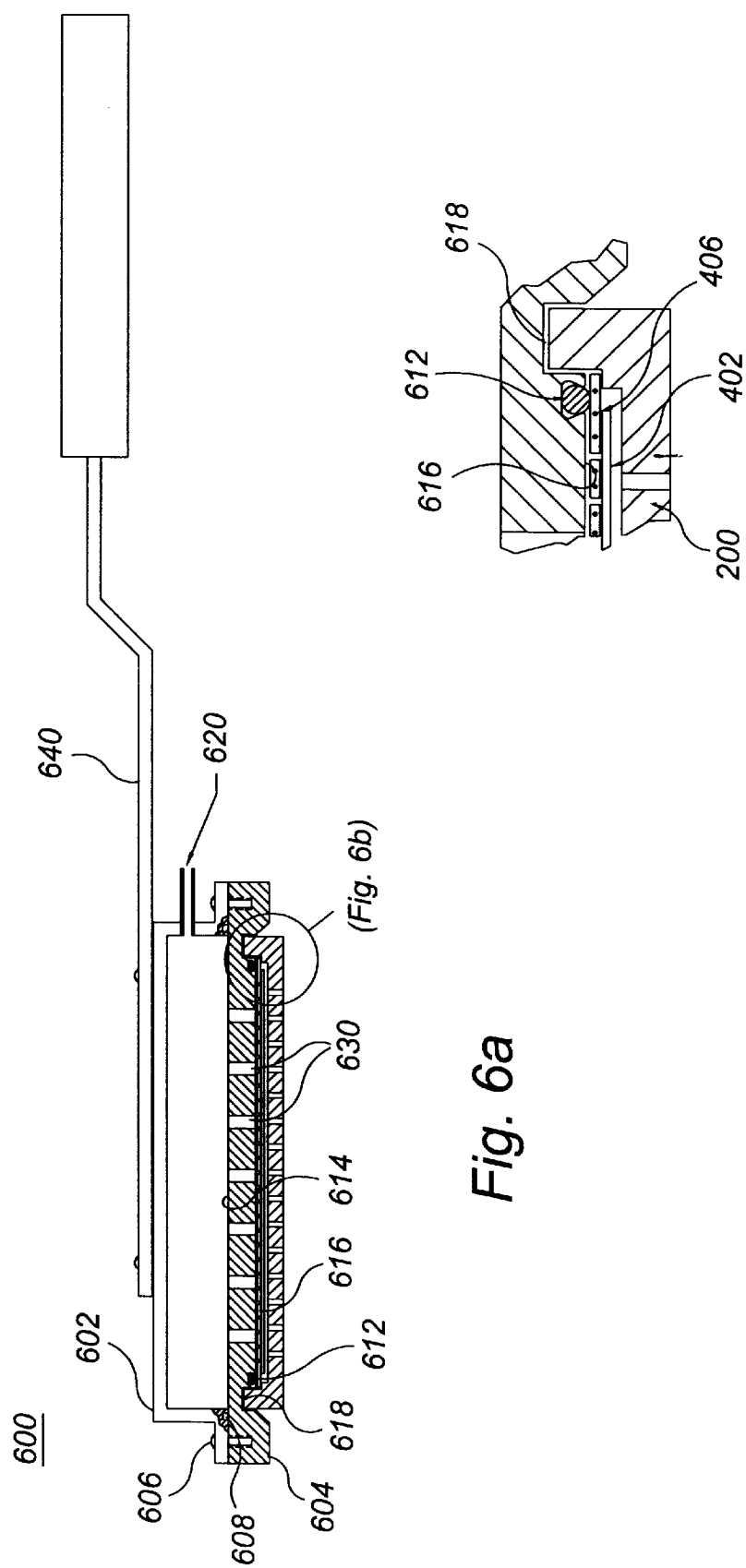

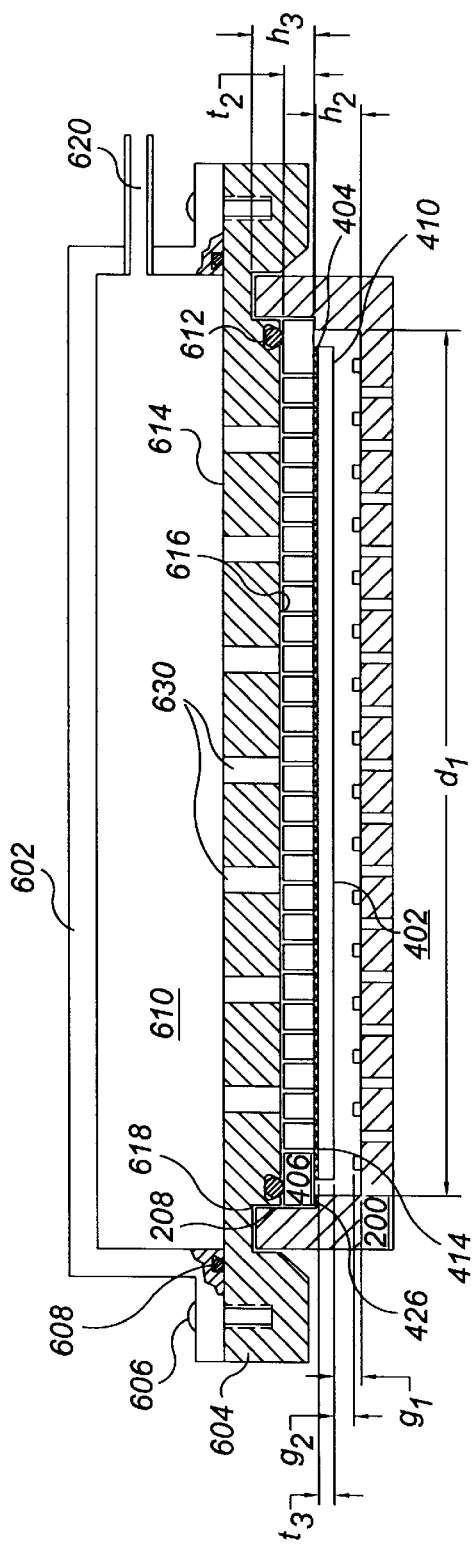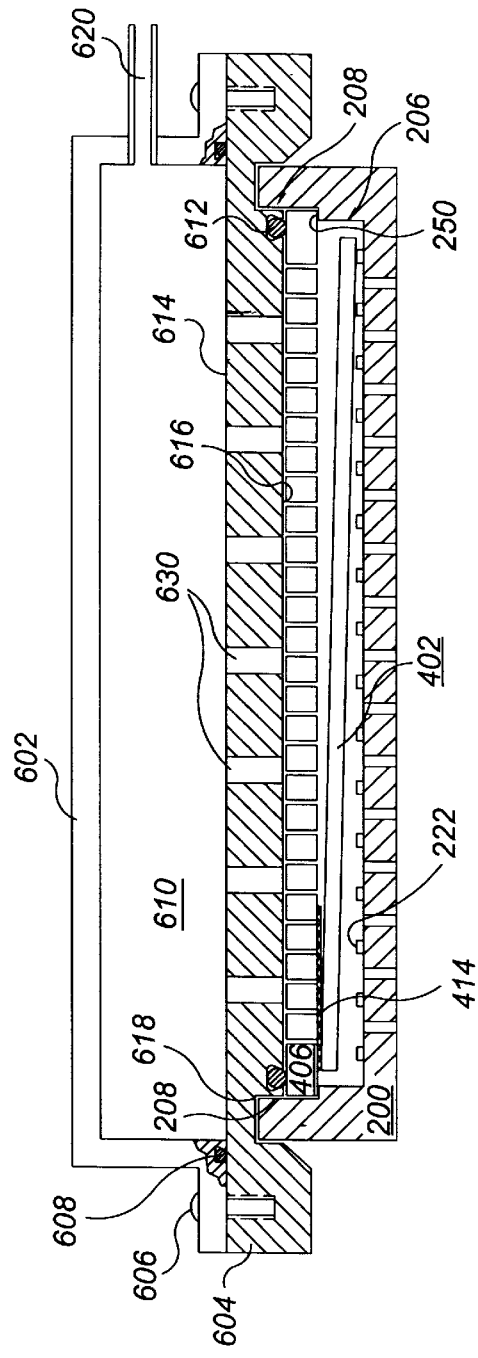

WAFER DEMOUNT GAS DISTRIBUTION TOOL

RELATED APPLICATIONS

This application is related to U.S. application Ser. No. 09/756,849, filed on even date herewith, entitled "Wafer Demount Receptacle for Separation of Thinned Wafer from Mounting Carrier," and having the following inventors: Bhola De and Daniel Stofman, the entire disclosure of which is incorporated herein by reference hereto.

TECHNICAL FIELD

The present invention is directed to the field of equipment and accessories for processing semiconductor wafers. More particularly, it is directed to a receptacle and tool which are used to demount a semiconductor wafer from a carrier following one or more steps in a manufacturing operation.

BACKGROUND OF THE INVENTION

During semiconductor manufacture, a semiconductor wafer undergoes a number of processing steps where it is exposed to potentially aggressive conditions including, but not limited to, chemical and physical contact, pressure, and temperature. These conditions may be deleterious to the features contained on the wafer or to the wafer itself. For example, the process of thinning a wafer for packaging, either by chemical or physical means, can result in wafer fracture. It is common, therefore, to mount the wafer to a carrier which provides support and stability to the wafer during processing. An adhesive means is commonly used to bond the wafer to the carrier to prevent slippage.

A wafer can be mounted to a carrier and retained in a number of ways. FIGS. 1a–1c show a semiconductor wafer partially adhered to a carrier by different adhesive means. FIG. 1a shows a wafer partially adhered using an adhesive layer such as epoxy or tape. FIG. 1b shows a wafer partially adhered using molecular Van der Waals forces. FIG. 1c shows a wafer partially adhered using a remote vacuum source. In each of these examples, the wafer exhibits a measurable deflection or strain due to the force of gravity acting on the unsupported area of the wafer. If the deflection exceeds a certain critical value, which depends on certain physical properties of the wafer, the wafer will fracture.

At the conclusion of a series of wafer processing steps the wafer must be debonded from the carrier. The debonding of the wafer must be done with care so as to avoid fracturing the wafer. The prior art includes a number of devices which can be used to demount a wafer from a surface. Typically these devices involve mechanical means that may impart damage to the wafer. Examples of wafer demounting devices include tweezers, blades, or vacuum wands.

Other devices have been developed which are less intrusive to the wafer. U.S. Pat. No. 5,952,242 to Pietsch discloses a means for removing a semiconductor wafer from a flat substrate in which liquid is used to lift the semiconductor wafer from the substrate. The fixture includes a cylindrical removal head which is mounted on a carrier disc and surrounds a wafer mounted thereon. The cylindrical removal head is provided with circumferential U-shaped grooves on an inner surface thereof to accommodate blocking devices which capture the wafer once it has been dislodged from the carrier disc. In this example, the wafer is merely resting on the carrier disc and is not adhered to the carrier by an adhesive means.

U.S. Pat. No. 4,466,852 to Beltz et al. discloses an apparatus and method for dislodging a wafer from a carrier by forcing a liquid through a channel passing through the disc. The liquid impinges on a back surface of the wafer at a point that is off-center so as to apply a leveraged force for loosening the wafer. The disclosure states that an operator manually catches the wafer as it is dislodged.

U.S. Pat. No. 4,949,783 to Lakios et al. discloses a substrate transport and cooling apparatus. Forced convection is provided by a gas flowing into the area between a substrate and a cooling fixture at a pressure high enough to cause bowing or lifting of the substrate and thus to create a gas region between the substrate and the fixture. An O-ring near the periphery of the substrate substantially seals the gas from entering a processing chamber. The gas flow into and through the area between the substrate and cooling fixture absorbs heat from, and thereby cools the substrate.

U.S. Pat. No. 5,632,847 to Ohno et al. discloses a method for removing a film from a substrate comprising injecting ozone in to an acid aqueous solution, and bringing bubbles formed by the ozone injection into contact with the film. When the ozone of each bubble is brought into contact with the film on the substrate, an intermediate between ozone and the film is formed, and then the formed intermediate is removed from the substrate by the acid aqueous solution of each bubble.

During the manufacture of gallium arsenide (GaAs) wafers, the wafer is typically bonded to a carrier. As seen in FIG. 2a, carrier 150 has a circular shape with an overall diameter s1. The carrier 150 is divided into two overall portions, an annular peripheral surface 152 of width s3 and a wafer support surface 154 having a radius s2.

The support region is populated with a pattern of through-holes 162. FIG. 2b shows the carrier 150 having a semiconductor wafer 170 adhered thereto by means of an adhesive 172. The wafer 170 is mounted on the top surface 174 of the carrier 150 at the wafer support surface 154, thereby leaving the peripheral surface 152 exposed. The carrier also has a back surface 176.

Given the brittleness of the semiconductor wafer 170 and the carrier 150, it is a challenge to dismount the wafer 170 from the carrier 150 without damaging either.

SUMMARY OF THE INVENTION

One device in accordance with the present invention comprises a wafer demount receptacle for removing a semiconductor wafer from a mounting carrier. The wafer demount receptacle includes a plate member that contains a pattern of through holes. The perimeter of the plate member comprises an upstanding rim structure which is stepped and includes a first step associated with a first riser and a first run, and a second step associated with a second riser. The run of the first step is shaped and sized to accommodate by abutment, a peripheral portion of a wafer carrier, to which a semiconductor wafer is bonded. When resting on the run of the first step, the wafer carrier is in an inverted orientation so that the semiconductor wafer rests in a space between the carrier and the plate member. The riser of the first step has a very low height so that the plate member limits the deflection of the wafer in a direction towards the plate member as the wafer is demounted from the carrier.

In one aspect of the invention, the wafer demount receptacle's plate member is substantially circular, having a rim member including a first step defining a first diameter, and a second step defining a second diameter greater than the first diameter.

In another aspect of the invention, the wafer demount receptacle has unitary construction, being formed such as by casting or machining from a single piece of material. The material of construction may be any suitable material such as quartz or sapphire, but preferably is formed from stainless steel or alumina.

A second device of the present invention comprises a wafer demount gas distribution tool for removing a semiconductor wafer from a wafer carrier. The gas distribution tool comprises a gas shower head with a gas inlet port and a substantially flat external face having an operative gas distribution surface containing a pattern of through holes which serve as gas outlet ports. A peripheral sealing member provided around a perimeter of the operative gas distribution surface, helps form a seal between the operative gas distribution surface and an opposing surface against which the gas distribution tool is abutted.

In one aspect, the gas distribution tool's operative gas distribution surface is substantially circular and the peripheral sealing member is a toroidal O-ring. With such a geometry, the gas distribution tool can be used in conjunction with the wafer demount receptacle for removing a semiconductor wafer from a wafer carrier. This is done by positioning the gas distribution tool with its operative gas distribution surface and O-ring juxtaposed against the back side of wafer carrier mounted in the wafer demount receptacle.

A first method in accordance with the present invention for debonding a wafer from a wafer carrier includes the steps of providing a wafer demount receptacle having an upstanding rim member, placing a wafer carrier in an inverted position such that a portion of the rim member supports a periphery of the wafer carrier, contacting the wafer carrier with a solvent to promote separation of the semiconductor wafer from the wafer carrier, whereby an edge of the semiconductor wafer first separates from the wafer carrier and the wafer partially rests on the plate member, and then a remaining portion of the semiconductor wafer separates from the wafer carrier such that the semiconductor wafer rests entirely on the plate member.

A second method in accordance with the present invention for debonding a wafer from a wafer carrier includes the steps of providing a wafer demount receptacle having an upstanding rim member, placing a wafer carrier in an inverted position such that a portion of the rim member supports a periphery of the wafer carrier with a semiconductor wafer mounted on the wafer carrier attached facing in a downward direction, contacting the wafer carrier with a solvent to promote separation of the semiconductor wafer from the wafer carrier, fully dissolving the adhesive, placing the operative gas distribution surface of the gas distribution tool in contact with the back surface of the carrier, flowing gas through the gas distribution tool, whereby gas bubbles are formed between the wafer carrier and the semiconductor wafer, an edge of the semiconductor wafer first separates from the wafer carrier and the wafer partially rests on the plate member, and then a remaining portion of the semiconductor wafer separates from the wafer carrier such that the semiconductor wafer rests entirely on the plate member.

In an aspect of either the first or the second method, the wafer carrier in abutment with the wafer demount receptacle is placed in a rack along with other such carrier/receptacle assemblies, and the rack is placed in a tank, prior to the step of contacting the wafer carriers with a solvent.

BRIEF DESCRIPTION OF THE DRAWINGS

The present invention can better be understood from the following detailed description when read in conjunction with the attached figures wherein:

FIG. 3d shows a detail of the rim structure seen in FIG. 3a;

FIG. 5b shows a side view of the wafer demount assembly rack of FIG. 5a.;

FIG. 6a shows a cross-sectional view of a wafer demount gas distribution tool;

FIG. 6b shows a detail of the tool of FIG. 6a;

FIG. 7a shows a wafer demount assembly and wafer demount gas distribution tool with the wafer fully adhered via liquid surface tension to the wafer carrier;

FIG. 7b shows a wafer demount assembly and wafer demount gas distribution tool with the wafer partially adhered via liquid surface tension to the wafer carrier.

DETAILED DESCRIPTION OF THE INVENTION

Figure 3A:
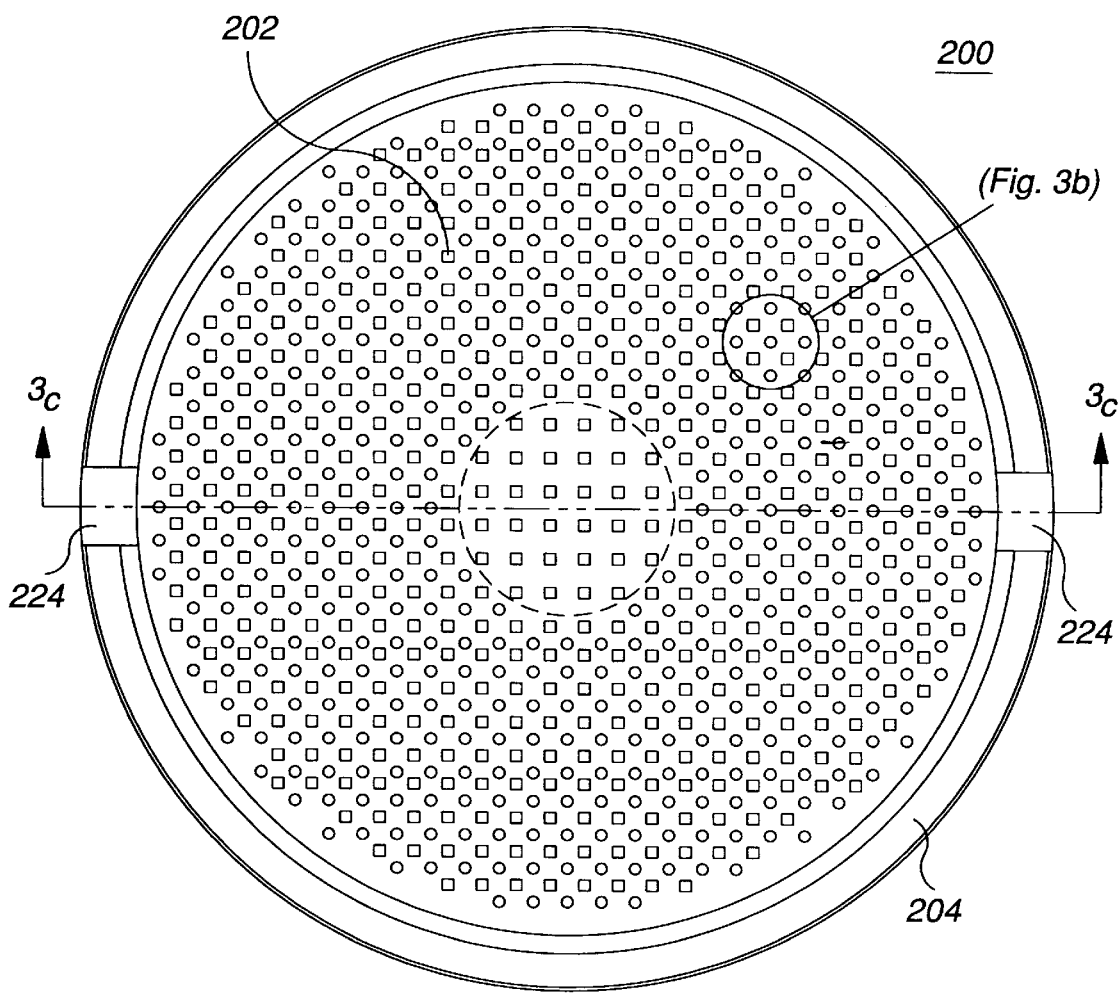
FIG. 3a shows a plan view of a wafer demount receptacle in accordance with the present invention.

FIG. 3a shows a plan view of the wafer demount receptacle 200 of the present invention. The receptacle 200 preferably comprises a central plate member 202 and an upstanding rim structure 204 formed along the periphery thereof. Preferably, the receptacle has unitary construction, being cast or machined from a single piece of material, such as stainless steel, although other materials may also be used. In a preferred embodiment, the wafer demount receptacle is formed from stainless steel or alumina.

Figure 3B:
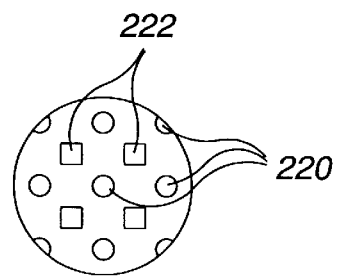
FIG. 3b shows a detail of the plate member showing the through-holes and pedestals.
Figure 3C:
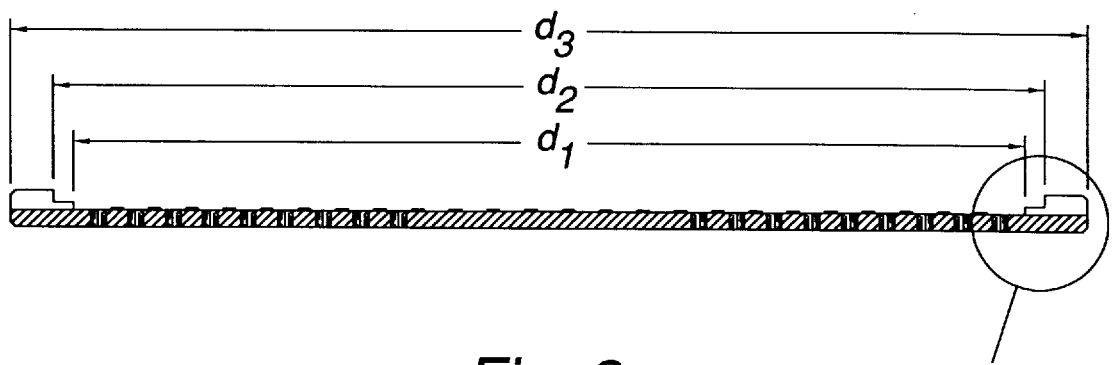
FIG. 3c shows a cross-section of FIG. 3a taken along line 3c–3c.
Figure 3D:
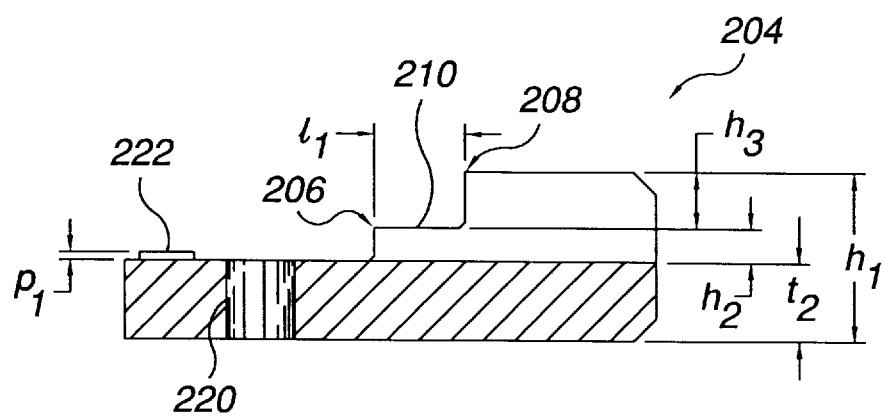

As best seen in FIGS. 3b and 3d, the plate member 202 of the receptacle contains a pattern of through holes 220 interspersed among a plurality of raised pedestals 222, each having a height p1. When a wafer is de-mounted from a carrier, the wafer falls onto these pedestals 222, which support the wafer at a multiplicity of discrete locations on the wafer's surface. Consequently, portions of the wafer which are not abutted by the pedestals 222 are exposed so as to facilitate the movement of a gas or fluid across the surface of the wafer.

Preferably, the holes 220 are centered on a first square grid of size 6 mm×6 mm, and the pedestals 222 are centered a second square grid of the same size which is interleaved with the first square grid, as seen in FIGS. 3a and 3b. Preferably, the holes 220 have a 3 mm diameter and pedestals 222 have a 2 mm×2 mm square profile when viewed from the top, with height p1 being approximately 0.25 mm. While the above measurements are preferred, other dimensions may also be suitable.

The rim structure 204 preferably does not extend around the entire circumference of the receptacle 200, but rather is provided with at least a pair of pick-up gaps 224 which are configured and dimensioned to accommodate a pair of tweezers or other handling means used to manipulate the receptacle.

As seen in FIGS. 3c–3d, the plate member 202 has a thickness of t2 which in a preferred embodiment is about 3 mm, although a wide range of thickness, such as between 1.0 and 5.0 mm may suffice. Furthermore, the rim structure 204 is stepped, with a first step 206 defining a first diameter d1, and a second step 208 defining a second diameter d2 greater than the first diameter d1. The receptacle 200 has an overall diameter d3. In a preferred embodiment, d1 is about 153 mm; d2 is 159.2 mm and d3 is 175.0 mm, although they could be of other sizes, as well. It is noteworthy, however, that d2 preferably is just slightly larger than twice the radius (i.e., the diameter) of the carrier 150, for reasons that will become apparent below. It should be appreciated that the physical dimensions of the demount fixture 200 scale with the size of the semiconductor wafer and carrier. Given a 150 mm diameter semiconductor wafer, for example, the demount fixture can have a first step diameter which is slightly greater than 150 mm.

As also seen in FIG. 3d, the rim structure 204 provides the receptacle with an overall height of h1, h1 preferably being about 6.25 mm. The rim structure itself comprises a first step 206 having a height h2 relative to the plate member, and a second step 208 having a height h3 relative to the first step. In a preferred embodiment, the first step height h2 is approximately 1.25 mm while the second step height h3 is approximately 2.0 mm. The run 210 of the first step, which in a preferred embodiment has a length l1 of approximately 3.1 mm, serves as a carrier support surface during wafer de-mounting operations.

Figure 1A:
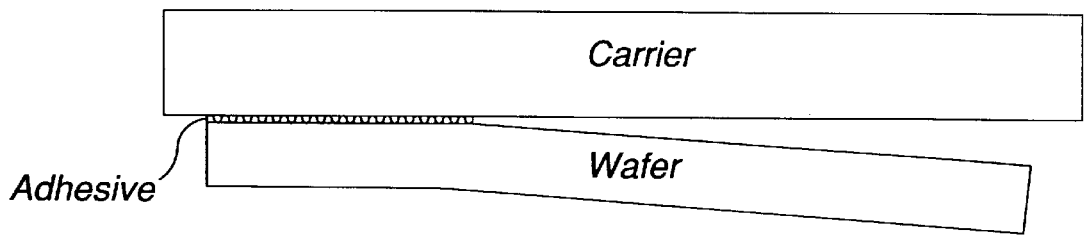
FIGS. 1a–1c show conventional arrangements in which a semiconductor wafer is partially adhered to a carrier using various adhesive means.
Figure 1B:
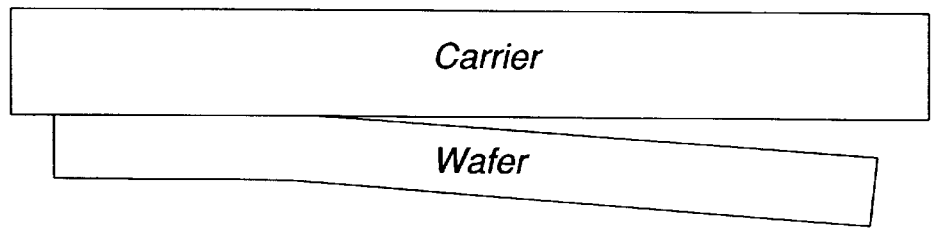
Figure 1C:
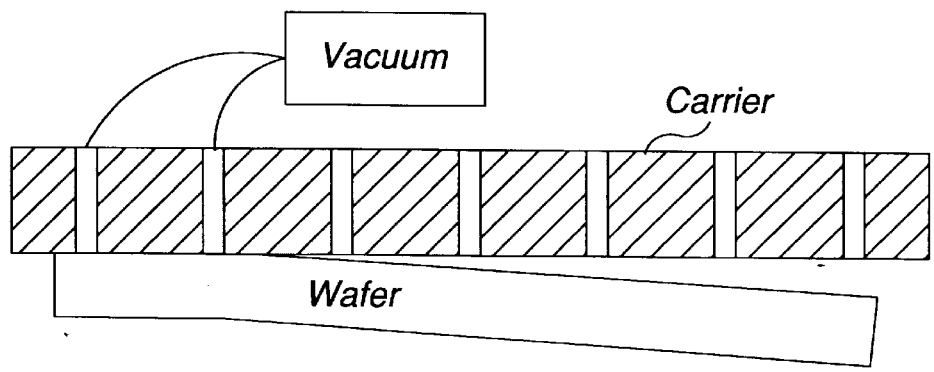
Figure 2A:
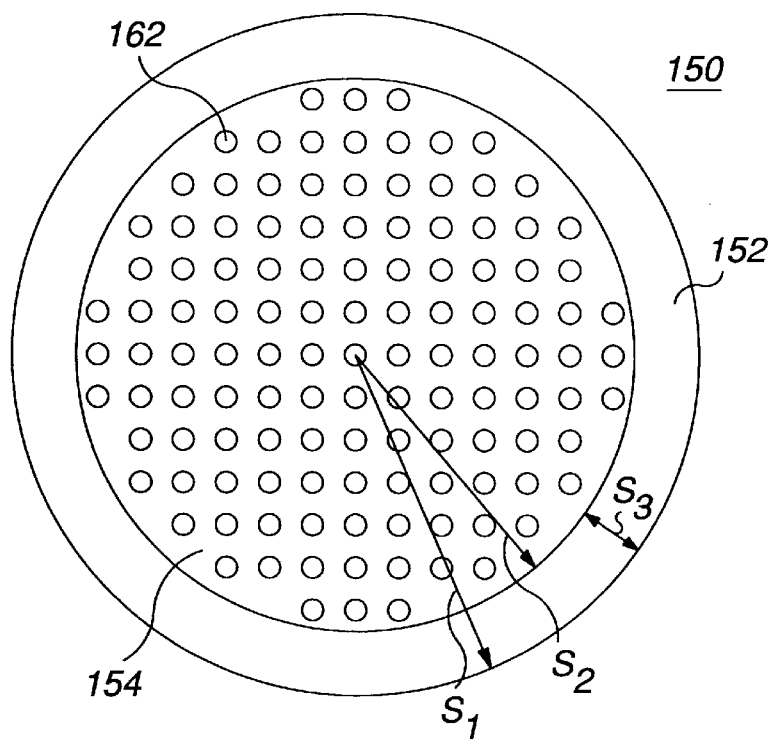
FIG. 2a shows a plan view of a prior art carrier.
Figure 2B:
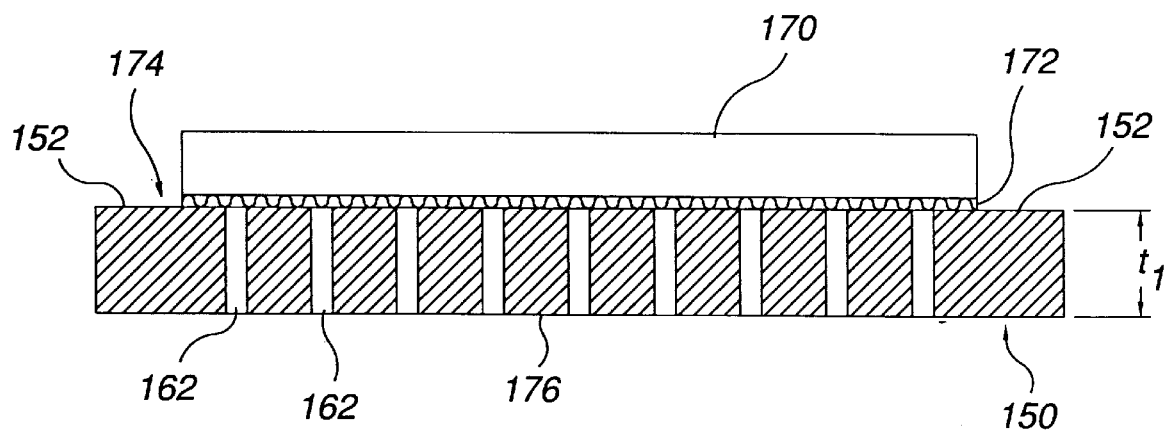
FIG. 2b shows the carrier of FIG. 2a having adhered thereto a semiconductor wafer.
Figure 4A:
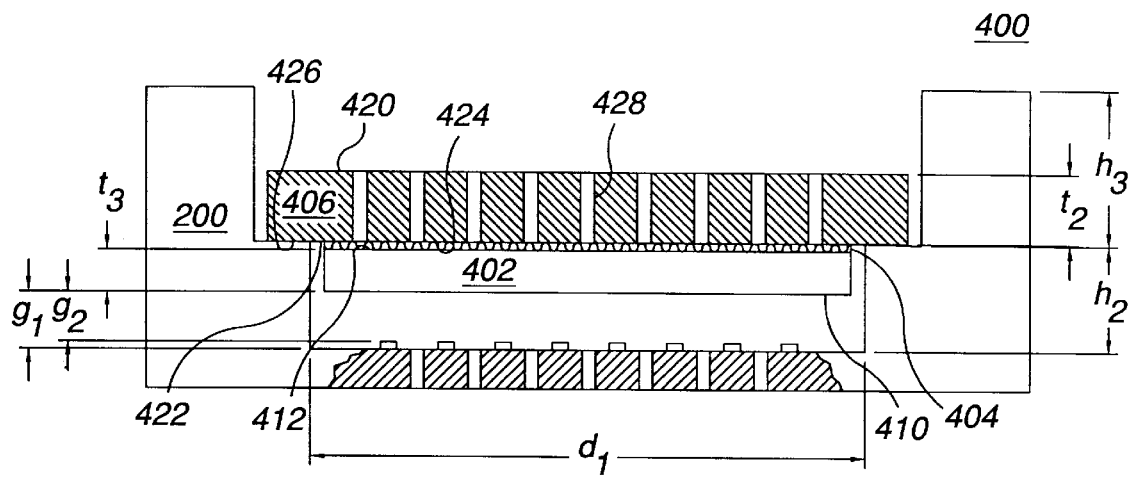
FIG. 4a shows a wafer demount assembly with the wafer fully affixed to the wafer carrier.

FIG. 4a shows a wafer demount assembly 400 in accordance with a preferred embodiment of the present invention. The wafer demount assembly 400 comprises a wafer demount receptacle 200 in contact with a peripheral abutment surface 426 of a carrier 406 to which is adhered a semiconductor wafer 402. In FIG. 4a the semiconductor wafer 402 is affixed by means of an adhesive 404 to the carrier 406. Wafer 402, adhesive 404 and carrier 406 can be substantially similar to the wafer 170, adhesive 172 and carrier 150 seen in FIG. 2. The wafer 402 has an active wafer surface 410 on a first side, which may contain features and circuits built thereon (not shown), and an inactive wafer surface 412 on a second side. The carrier has a bottom surface 420 on a first side and a top surface 422 on a second side. The top surface 422 of the carrier is comprised of two regions, a wafer contact surface 424, and a peripheral abutment surface 426. The inactive wafer surface 412 is bonded by means of the adhesive 404 to the wafer contact surface 424 of the carrier.

The body of the carrier 406 contains a pattern of through holes 428, which allows solvent to contact and dissolve the adhesive 404 during the demounting step. The through holes 428 also promote the generation of eddy currents in the solvent during the demounting step to help bring the solvent in contact with the adhesive 404 at the interface between the carrier's wafer contact surface 424 and the inactive wafer surface 412.

FIG. 4a further shows the wafer carrier 406 in contact with the demount receptacle 200 of the present invention. The peripheral abutment surface 426 of the carrier abuts the demount receptacle 200 at a carrier support surface 250 formed on the run 210 of the first step 206. The wafer diameter is less than the diameter d1 of the first step 206, while the wafer carrier diameter is less than the diameter d2 of the second step 208. Furthermore, the carrier thickness t1 preferably is less than the height h3 of the riser of the second step 208 of the demounting receptacle 200. The wafer thickness t3 is less than the height h2 of the first step 206 such that a first receiving gap g1 is formed between the wafer and the wafer receiving surface 222 and a second receiving gap g2 is formed between the wafer and the receiving pedestals 222, g1>g2. In a preferred embodiment, gap g1 is less than about 2.0 mm.

To dislodge the wafer, the wafer demount assembly 400 preferably is oriented as shown in FIG. 4a, i.e., with the active surface of the wafer facing downward so as to fall onto the plate member and/or pedestals. A solvent is then applied to the assembly, the solvent passing at least partially through the holes 428 formed in the carrier 406 to thereby attack the adhesive from the backside of the wafer 402. In this manner, the adhesive 404 is removed from the carrier-wafer interface as the assembly comes into contact with the solvent. In normal operation, during adhesive removal, the wafer 402 is partially adhered to the carrier 406 at one instant, and then completely demounted from the carrier 406 at another. The solvent acting on the back side of the wafer 402, in combination with the force of gravity incrementally causes separation of the wafer 402.

Figure 4B:
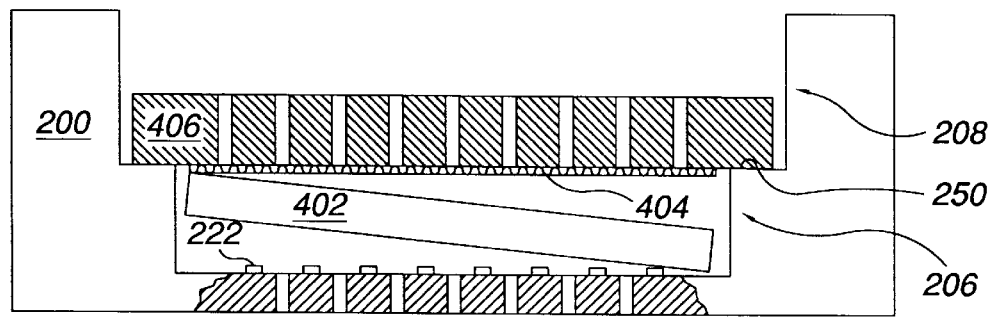
FIG. 4b shows the wafer demount assembly of FIG. 4a with an edge of the wafer partially debonded from the wafer carrier.

As seen in FIG. 4b, at some point, one edge of the wafer becomes detached from the carrier 406, and the wafer slightly deforms under the weight of the separated edge. If this deformation proceeds unabated, the wafer may fracture before it is completely demounted from the carrier. However, the design of the present invention helps prevent wafer breakage during the demount process. Further deformation of a detached portion of the wafer 402 is stopped when the wafer contacts the wafer receiving surface of the plate member 202 or, if present, one or more pedestals 222. Limiting the maximum bending in this manner helps prevent wafer breakage. Furthermore, because the wafer 402 is contained within the space between the receptacle 200 and the carrier, it is protected from external disturbances which may damage critical features or cause catastrophic fracture of the wafer.

Figure 4C:
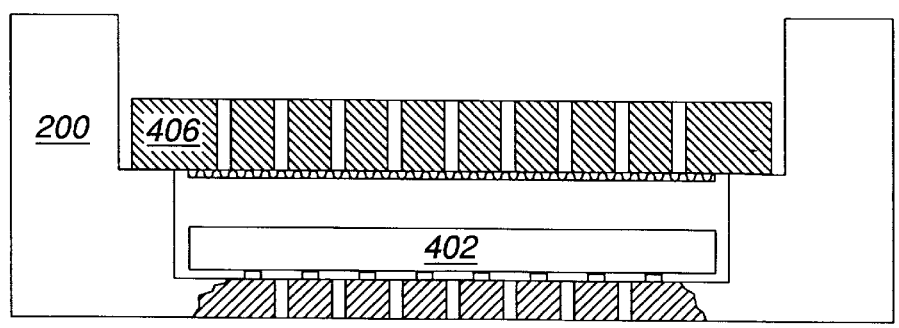
FIG. 4c shows the wafer demount assembly of FIG. 4a with the wafer fully debonded from the wafer carrier and resting on the wafer support surface.

Ultimately, as seen in FIG. 4c, the wafer 402 is fully demounted and rests on the pedestals, leaving space between the non-pedestalled portions of the plate member 202 and the wafer 402.

It should be noted that the peripheral abutment surface of the wafer carrier need not be entirely circumferential. For instance, the wafer carrier may be provided with a plurality of discrete tabs circumferentially spaced apart from one another along the periphery. In such case, the discrete tabs serves as peripheral abutment surfaces, supported by complementary surfaces formed on the rim member of the wafer demount receptacle. Such an arrangement can be advantageous, if one wishes to maintain indexability of the wafer carrier relative to the wafer demount receptacle. Additionally, the peripheral abutment surface of the wafer carrier and the carrier support surface need not be planar, but may instead have complementary non-planar structures so as to facilitate positioning the former onto the latter, such as in a dovetail fashion.

Figure 5A:
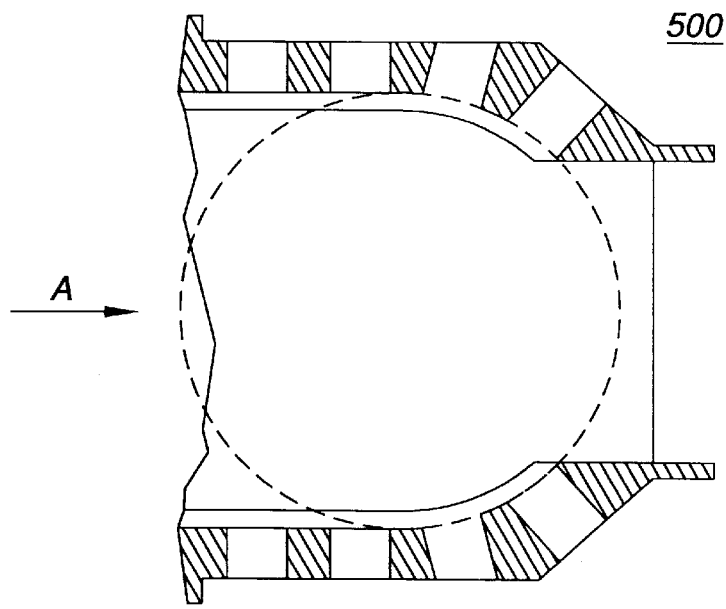
FIG. 5a shows a top view of a wafer demount assembly rack.
Figure 5B:
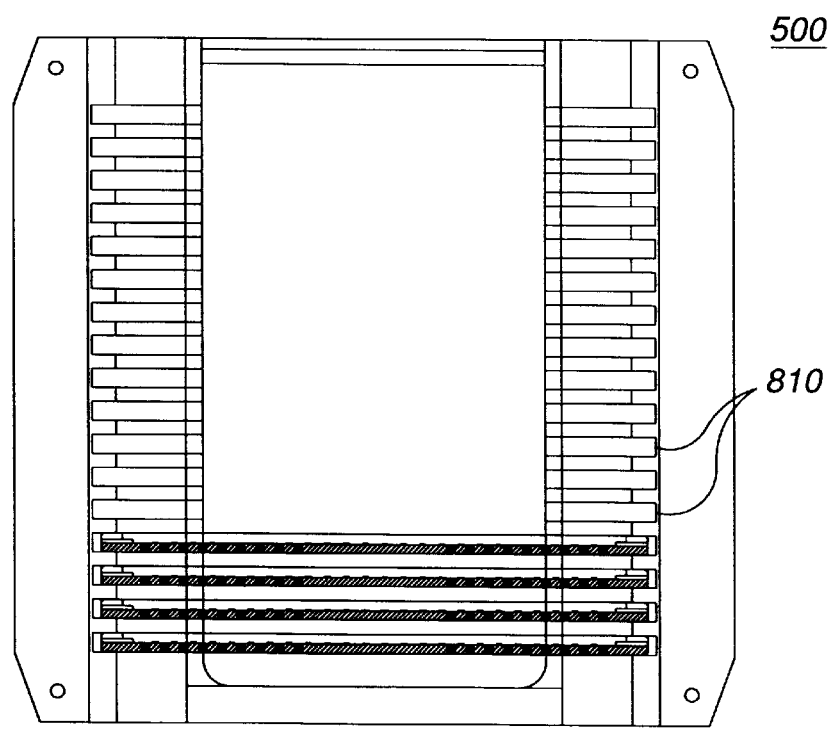

Multiple wafers can be demounted simultaneously by placing several demount assemblies 400 in a rack or cassette that is in turn placed in a tank for contact with flowing solvent. FIG. 5*a* shows a top view of a rack 500 with the outline of a wafer demount assembly 400 shown in phantom, and FIG. 5*b* shows a side view of the rack 500. The carrier comprises a substantially hollow frame configured with a plurality of parallel slots 810. In the device shown in FIG. 5*b*, a total of 17 slots are provided, although racks of other capacities may also be provided. Each slot has an opening sized to accommodate a single wafer demount assembly 400, which is inserted into the slot in the direction of the arrow A seen in FIG. 5*a*.

Once the wafer demount assemblies are loaded into the rack 500, the rack is lowered into a tank which is connected to a pump configured to circulate solvent therein. The rate of solvent flow is controlled by the pump with the tank and connections preferably arranged such that the solvent flows parallel to the surfaces of the wafer demount assemblies 400. Eddy currents are generated in the solvent flow via interaction of the solvent with the holes 220 in the wafer demount receptacle 200. The holes 428 in the wafer carrier also help to generate eddy currents which accelerate the dissolution of adhesive and hasten debonding the wafer.

FIG. 6*a* shows a wafer demount gas distribution tool 600 in accordance with a preferred embodiment of the present invention. The gas distribution tool 600 comprises a chamber 610 defined between a backing plate 602 and a contact plate 604 secured to one another by means of screws 606. A handle 640 is preferably attached to the backing plate 602, to facilitate transport and operation of the gas distribution tool. The chamber 610 is provided with a gas inlet port 620 which, in a preferred embodiment, is formed in a lateral wall of the backing plate 602 and is connectable to a pressurized gas source (not shown). The contact plate 604 has an internal surface 614 and an external, operative gas distribution surface 616 connected by a pattern of through holes which serve as gas outlet ports 630. The gas outlet ports preferably have a diameter which is between about 3 to 6 mm, and more preferably about 5 mm, although other dimensions may also be suitable.

When the gas distribution tool 600 is in use, a pressurized gas source (not shown) is connected to the gas inlet port, and the pressurized gas is forced through the gas outlet ports 630. A first, peripheral sealing member, preferably formed as a first O-ring 612, protrudes from the contact plate 604 from within a groove formed along a periphery of the operative gas distribution surface 616, thereby encircling the latter. A second sealing member, formed as a second O-ring 608, forms a gas seal between the backing plate 602 and a contact plate 604 to retard, if not fully prevent, the escape of gases from chamber 610 at the interface between the two plates.

While the embodiment of FIG. 6*a* shows separate backing plates and contact plates, it is understood that a chamber having a backing plate and contact plate as portions of a single continuous material made, for example, by injection molding, followed by any necessary machining or other operations, is also contemplated. In such case, then, the first O-ring 608 and screws 606 would be unnecessary. Similarly, the present invention also contemplates a chamber formed by welding two or more plates.

As seen in FIGS. 7*a* and 7*b*, during the wafer demounting process, when the adhesive is fully dissolved by liquid solvent 414, a thin film of solvent may remain at the interface between the wafer and the carrier causing the wafer to remain adhered via solvent-induced surface tension to the carrier 406. This surface tension may be overcome by using the gas distribution tool 600 of the present invention in conjunction with the wafer demount receptacle 200.

Removal of the wafer from the carrier is accomplished by juxtaposing the operative gas distribution surface 616 of the wafer demount gas distribution tool with the backside 420 of the wafer carrier. To facilitate alignment between the two, the gas distribution tool is provided with an alignment groove 618 which is formed along a perimeter of the external surface of the contact plate, and situated radially outward of the peripheral sealing member 612. The alignment groove 618 dovetails with the second step 208 of the wafer demount receptacle. As shown in the detail of FIG. 6*b*, the perimeter alignment groove 618 causes the second O-ring 612 of the gas distribution tool to align with a perimeter of the back side 420 of the wafer carrier in order to form a gas seal between the gas distribution tool and wafer carrier.

Figure 7C:
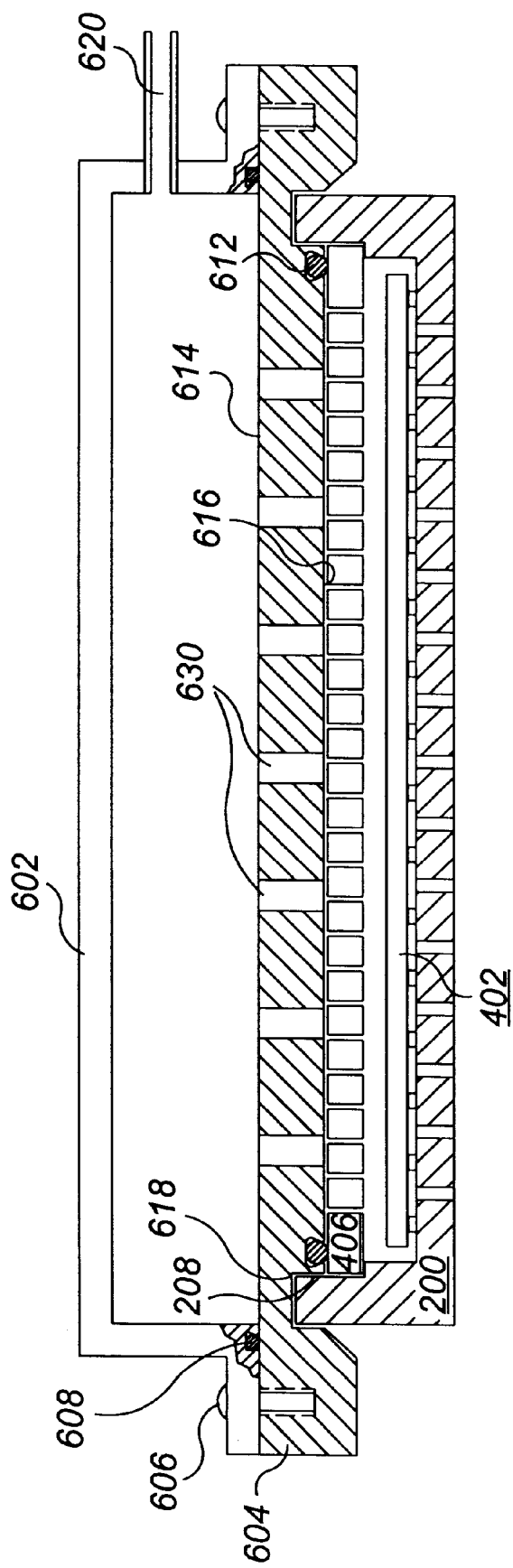
FIG. 7c shows a wafer demount assembly and wafer demount gas distribution tool with the wafer fully debonded from the wafer carrier and resting on the wafer support surface.

When the gas distribution tool 600 and the backside 420 of the wafer carrier are in abutment, gas flowing into the chamber 610 exits through holes 630, and is forced through carrier through holes 428 to the wafer-carrier interface. At the wafer-carrier interface, the forced gas displaces the solvent by forming small bubbles. The formation of gas bubbles and the concomitant displacement of solvent from the wafer-carrier interface (FIG. 7*b*) overcomes the liquid surface tension and assists in completely removing the wafer from the carrier (FIG. 7*c*). The gas may be selected from the group consisting of argon, helium, nitrogen, air, or mixtures thereof, though other gases and mixtures may be suitable. The gas pressure and flow are optimized and regulated to prevent breakage of the wafer by impact on the plate member 202 and/or pedestals 222.

It should be appreciated that while the wafer demount receptacle and operative gas distribution surface 616 of the gas distribution tool are preferably circular, their principal shapes are designed to conform to the circular shape of a typical wafer carrier which itself supports a circular semiconductor wafer. The wafer demount receptacle and gas distribution tool, therefore, may be of any suitable shape to accommodate the geometry of a carrier onto which a semiconductor wafer is bonded. Accordingly, if a semiconductor wafer is some other shape, say, triangular, a corresponding carrier may (but need not necessarily) be triangular, in which case the wafer demount receptacle and gas distribution tool may also have a similar shape.

While the invention has been illustratively described herein with reference to specific aspects, features and embodiments, it will be appreciated that the utility and scope of the invention is not thus limited and that the invention may readily embrace other and differing variations, modifications and other embodiments. The invention therefore is intended to be broadly interpreted and construed, as comprehending all such variations, modifications and alternative embodiments, within the spirit and scope of the ensuing claims.

What is claimed is:

1. A wafer demounting gas distribution tool including:

a chamber defined in part by a first plate provided with a plurality of through holes forming an operative gas distribution surface on an external surface of the first plate;

a gas inlet port connectable to a pressurized gas source and configured to introduce a gas into the chamber;

a peripheral sealing member protruding from the first plate and encircling the operative gas distribution surface; and an alignment groove formed along a perimeter of the first plate and being situated radially outward of the peripheral sealing member.

2. The wafer demounting gas distribution tool of claim 1, further comprising a handle fixed to the chamber.

3. The wafer demounting gas distribution tool of claim 1, wherein the chamber is defined between the first plate and a second plate, with a second sealing member positioned between the two plates.

4. The wafer demounting gas distribution tool of claim 3, further comprising a handle fixed to the chamber.

5. The wafer demounting gas distribution tool of claim 4, wherein the handle is fixed to the second plate.

* * * * *

UNITED STATES PATENT AND TRADEMARK OFFICE
CERTIFICATE OF CORRECTION

PATENT NO. : 6,470,946 B1
DATED : October 29, 2002
INVENTOR(S) : Tsutomu Takatsuka and Akira Nakao It is certified that error appears in the above-identified patent and that said Letters Patent is hereby corrected as shown below:

<u>Column 16,</u>
Line 43, please change "pH of 6.08-8.5." to -- pH of 6.0-8.5. --

Signed and Sealed this

Twenty-eighth Day of December, 2004

JON W. DUDAS
*Director of the United States Patent and Trademark Office*